United States Patent
Shim et al.

(10) Patent No.: US 7,851,345 B2
(45) Date of Patent: Dec. 14, 2010

(54) SEMICONDUCTOR DEVICE AND METHOD OF FORMING OXIDE LAYER ON SIGNAL TRACES FOR ELECTRICAL ISOLATION IN FINE PITCH BONDING

(75) Inventors: SeongBo Shim, Kyoung-gi-Do (KR); KyungOe Kim, Kyoung-gi-Do (KR); YongHee Kang, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 289 days.

(21) Appl. No.: 12/051,349

(22) Filed: Mar. 19, 2008

(65) Prior Publication Data

US 2009/0236738 A1 Sep. 24, 2009

(51) Int. Cl.
*H01L 21/44* (2006.01)
*H01L 23/48* (2006.01)
*H01L 23/52* (2006.01)
*H01L 29/40* (2006.01)

(52) U.S. Cl. ............... 438/612; 257/779; 257/E23.02; 257/E23.021; 257/E21.508

(58) Field of Classification Search ............... 438/612, 438/108; 257/737, 779, 778, E23.02, E23.021, 257/E21.508
See application file for complete search history.

(56) References Cited

U.S. PATENT DOCUMENTS

| | | | |
|---|---|---|---|
| 5,650,595 A | 7/1997 | Bentlage et al. | |
| 6,431,432 B1 * | 8/2002 | McCormick et al. | 228/254 |
| 6,622,380 B1 * | 9/2003 | Grigg | 29/840 |
| 6,809,262 B1 | 10/2004 | Hsu | |
| 7,057,284 B2 * | 6/2006 | Chauhan et al. | 257/737 |
| 2002/0011666 A1 * | 1/2002 | Tandy | 257/738 |
| 2004/0099961 A1 * | 5/2004 | Chu et al. | 257/781 |
| 2005/0277226 A1 | 12/2005 | Degani et al. | |

* cited by examiner

*Primary Examiner*—David A Zarneke
(74) *Attorney, Agent, or Firm*—Robert D. Atkins

(57) ABSTRACT

A semiconductor device has a semiconductor die with a solder bump formed on its surface. A contact pad is formed on a substrate. A signal trace is formed on the substrate. The pitch between the contact pad and signal trace is less than 150 micrometers. An electroless surface treatment is formed over the contact pad. The electroless surface treatment can include tin, ENIG, or OSP. A film layer is formed over the contact pad with an opening over the signal trace. An oxide layer is formed over the signal trace. The film layer and surface treatment prevent formation of the oxide layer over the contact pad. The film layer is removed. The solder bump is reflowed to metallurgically and electrically bond to the contact pad. In the event that the solder bump physically contacts the oxide layer, the oxide layer maintains electrical isolation between the solder bump and signal trace.

25 Claims, 7 Drawing Sheets

US 7,851,345 B2

SEMICONDUCTOR DEVICE AND METHOD OF FORMING OXIDE LAYER ON SIGNAL TRACES FOR ELECTRICAL ISOLATION IN FINE PITCH BONDING

FIELD OF THE INVENTION

The present invention relates in general to semiconductor devices and, more particularly, to a semiconductor device having an oxide layer formed on the signal traces for electrical isolation from solder bumps formed on adjacent contact pads in fine pitch bonding applications.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

FIGS. 1a-1b show a conventional flip chip configuration with a solder mask dam disposed between the bond pads. In FIG. 1a, a semiconductor die or flip chip 10 is shown for mounting to chip carrier substrate or printed circuit board (PCB) 14. The PCB contains a plurality of bonding pads 18. Flip chip 10 includes a plurality of solder bumps 12 disposed on a backside of the die for interconnect to external devices. Flip chip 10 is mounted to PCB 14 in FIG. 1b. Solder bumps 12 are formed on bonding pads or under bump metallization layer (UBM) 15. An insulating layer 16 is formed on the backside of flip chip 10 over UBM 15. A portion of insulating layer 16 is removed to attach solder bumps 12 to UBM 15. A solder mask dam 20 is formed on substrate 14. Solder bumps 12 are then metallurgically and electrically connected to bond pads 18 on substrate 14. The solder mask dam contains the solder reflow over the bond pads.

Many flip chip designs call for a fine pitch, e.g., less than 150 micrometers (µm), between the interconnect structures, such as the solder bump pads and signal traces on the PCB, for a higher interconnect density and input/output (I/O) terminal count. The solder mask dam requires more lateral space and therefore limits the solder bump and signal trace pitch. Without a solder mask dam, the solder could bridge or short to adjacent signal traces during the solder reflow process to join the flip chip to the PCB. For example, solder bumps 12 are shown in FIG. 2 as being metallurgically and electrically connected to the intended bond pads 18 using a solder reflow process. During solder reflow in a fine pitch design, the solder material may extend over the adjacent signal traces 22 due to misalignment or irregular bump diameter. In this case, solder bumps 18 would electrically bridge or short to signal traces 22 causing a defect.

While most flip chip PCBs are fabricated with solder on pad (SOP) printing to make robust solder joints on the bond pad, in case of fine pitch bonding, the SOP treatment of controlled collapsible chip connection (C4) is limited due to potential solder bridges between adjacent interconnect structures.

SUMMARY OF THE INVENTION

A need exists to form reliable and robust solder joints between the flip chip and printed circuit board in fine pitch applications. Accordingly, in one embodiment, the present invention is a method of making a semiconductor device comprising the steps of providing a semiconductor die having a solder bump formed on a surface of the semiconductor die, providing a substrate, forming a contact pad on the substrate, forming a signal trace on the substrate, forming a solder mask over the signal trace with an opening over the contact pad, forming a surface treatment over the contact pad, removing the solder mask, forming a film layer over the contact pad with an opening over the signal trace, and forming an oxide layer over the signal trace. The film layer and surface treatment prevents formation of the oxide layer over the contact pad. The method further includes the steps of removing the film layer, and reflowing the solder bump to metallurgically and electrically bond to the contact pad. In the event that the solder bump physically contacts the oxide layer over the signal trace, the oxide layer maintains electrical isolation between the solder bump and signal trace.

In another embodiment, the present invention is a method of making a semiconductor device comprising the steps of providing a semiconductor die having a solder bump formed on a surface of the semiconductor die, providing a substrate, forming a contact pad on the substrate, forming a signal trace on the substrate, forming a surface treatment over the contact pad, forming a first film layer over the contact pad with an opening over the signal trace, and forming an insulating layer over the signal trace. The first film layer and surface treatment prevents formation of the insulating layer over the contact pad. The method further includes the steps of removing the first film layer, and reflowing the solder bump to metallurgically and electrically bond to the contact pad.

In another embodiment, the present invention is a method of making a semiconductor device comprising the steps of providing a semiconductor die having a solder bump formed on a surface of the semiconductor die, providing a substrate, forming a contact pad on the substrate, forming a signal trace on the substrate, forming a surface treatment over the contact pad, forming an insulating layer over the signal trace, and reflowing the solder bump to metallurgically and electrically bond to the contact pad. In the event that the solder bump physically contacts the oxide layer over the signal trace, the insulating layer maintains electrical isolation between the solder bump and signal trace.

In another embodiment, the present invention is a semiconductor device comprising a semiconductor die having a solder bump formed on a surface of the semiconductor die. A contact pad is formed on a substrate. A signal trace is formed on the substrate. A surface treatment is formed over the contact pad. An insulating layer is formed over the signal trace. The solder bump is metallurgically and electrically bonded to the contact pad. In the event that the solder bump physically contacts the oxide layer over the signal trace, the insulating layer maintains electrical isolation between the solder bump and signal trace.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 3A:
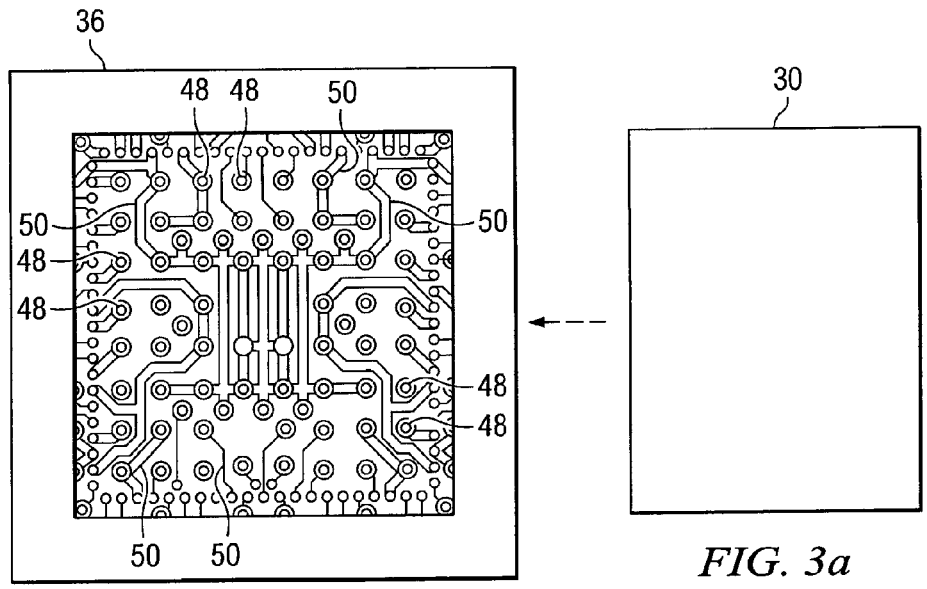
FIGS. 3a-3b illustrate a flip chip semiconductor device with solder bumps providing electrical interconnect between an active area of the die and a chip carrier substrate.
Figure 3B:
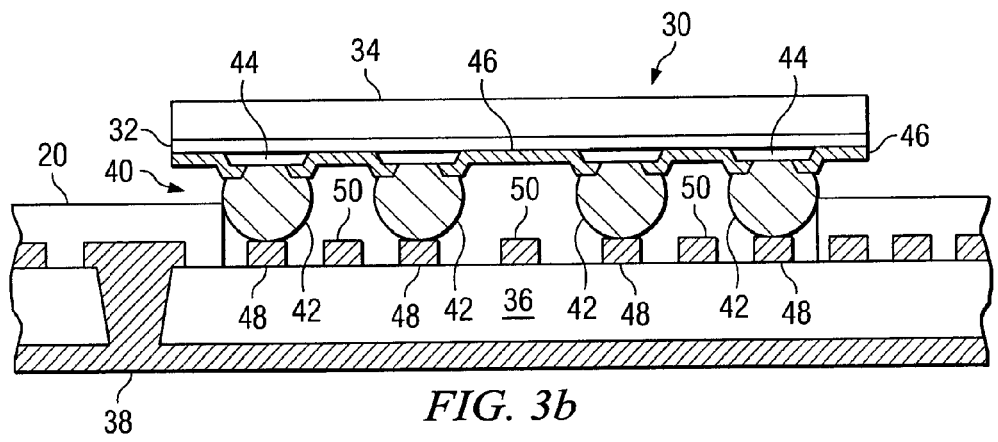

Flip chip semiconductor packages and wafer level packages (WLP) are commonly used with integrated circuits (ICs) demanding high speed, high density, and greater pin count. Flip chip style semiconductor device 30 involves mounting an active area 32 of semiconductor die 34 facedown toward a chip carrier substrate or printed circuit board (PCB) 36, as shown in FIGS. 3a and 3b. Region 38 is a copper plated area that shows blind via connected with inner metal layer. Active area 32 contains active and passive devices, conductive layers, and dielectric layers according to the electrical design of the die. The electrical and mechanical interconnect is achieved through a solder bump structure 40 comprising a large number of individual conductive solder bumps or balls 42. The solder bumps are formed on bump pads or interconnect sites 44, which are disposed on active area 32. The bump pads 44 are made by pattern and deposited as an electrically conductive layer over active area 32 using a physical vapor deposition (PVD), chemical vapor deposition (CVD), evaporation, sputtering, electrolytic plating, electroless plating, or other suitable deposition process. The conductive layer 44 can be made with aluminum (Al), Al alloy, copper (Cu), Cu alloy, tin (Sn), nickel (Ni), gold (Au), silver (Ag), or other electrically metal conductive material. The bump pads 44 may contain an under bump metallization layer (UBM) having a wetting layer, barrier layer, and adhesive layer. The bump pads 44 connect to the active and passive circuits by conduction tracks in active area 32. An insulating layer 46 is formed over active area 32 and bump pads 44. The insulating layer 46 can be made with silicon nitride (SixNy), silicon dioxide (SiO2), silicon oxynitride (SiON), tantalum pentoxide (Ta2O5), zircon (ZrO2), aluminum oxide (Al2O3), or other material having electrical insulation properties. The insulating layer can be dispensed as liquid encapsulant followed by spin-coating or spray coating dielectric material with different viscosity. The insulating layer can also be pressed or coated to cover the semiconductor die. A portion of insulating layer 46 is removed by an etching process to expose bump pads 44.

An electrically conductive solder material is deposited in the insulating layer opening over bump pads 44 using an evaporation, electrolytic plating, electroless plating, or ball drop process. The solder material can be any metal or electrically conductive material, e.g., Sn, lead (Pb), Ni, Au, Ag, Cu, bismuthinite (Bi), and alloys thereof. For example, the solder material can be eutectic Sn/Pb, high lead, lead free, or other solder materials. The solder material is reflowed by heating the material above its melting point to form solder bumps 42. In some applications, solder bumps 42 are reflowed a second time to improve electrical contact to bump pads 44.

The metal contact pad 48 and signal conductors or traces 50 are formed on PCB 36 by PVD, CVD, evaporation, sputtering, electrolytic plating, electroless plating, or other suitable metal deposition process. Contact pads 48 and signal traces 50 can be made with Cu, Al, Al/Cu alloys, or other electrically conductive metal. Signal traces 50 are formed adjacent to contact pads 48 with a fine pitch, e.g., less than 150 μm, to achieve a high density interconnect. The flip chip semiconductor device provides a short electrical conduction path from the active devices on die 34 to conduction tracks on PCB 36 in order to reduce signal propagation, lower capacitance, and achieve overall better circuit performance.

Figure 4A:
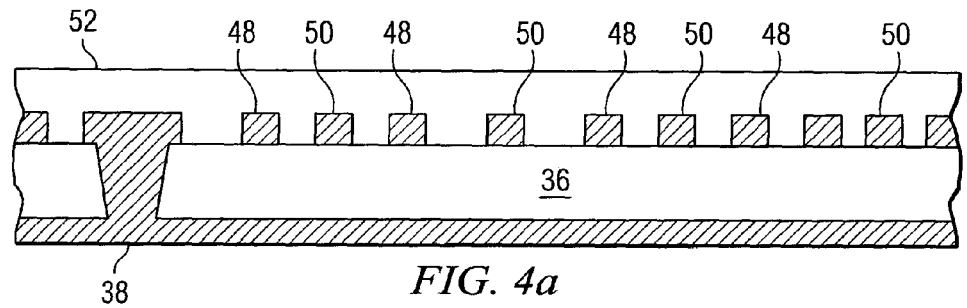
FIGS. 4a-4d illustrate a process of forming a surface treatment on the contact pads and an oxide layer on the signal traces.
Figure 4B:
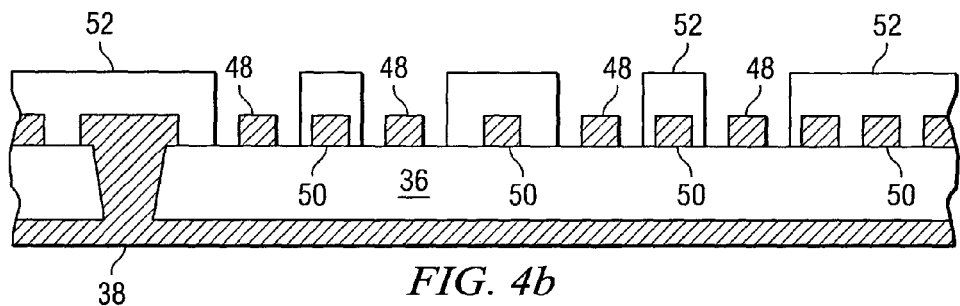

Further detail of forming the fine pitch, high density contact pads 48 and signal traces 50 is shown in FIGS. 4a-4d. FIG. 4a shows the multi-layer PCB 36 with a plurality of contact pads 48 and signal traces 50 formed on the PCB. A solder mask 52 is formed over contact pads 48 and signal traces 50. In FIG. 4b, the solder mask is patterned and exposed to ultraviolet (UV) light. The patterned area of solder mask 52 is developed to expose contact pads 48. An electroless surface treatment is applied to contact pads 48 by immersion in a solution of Sn, electroless nickel immersion gold (ENIG), or organic solderability preservative (OSP). FIG. 5a shows the electroless surface treatment 54 formed over contact pad 48.

Figure 1A:
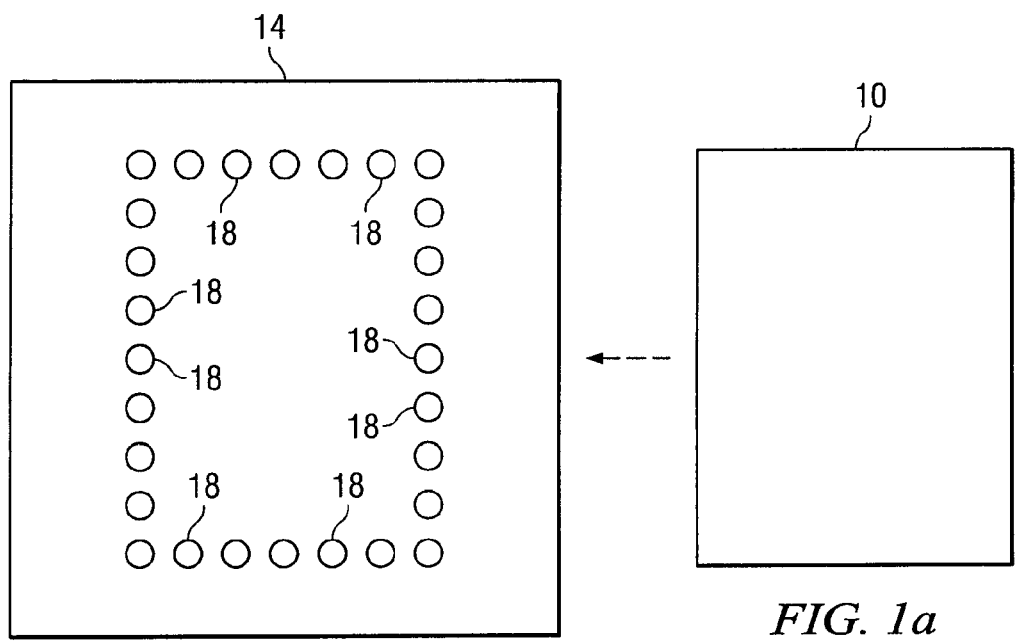
FIGS. 1a-1b illustrate a conventional flip chip with solder bumps connected to bonding pads on a PCB.
Figure 1B:
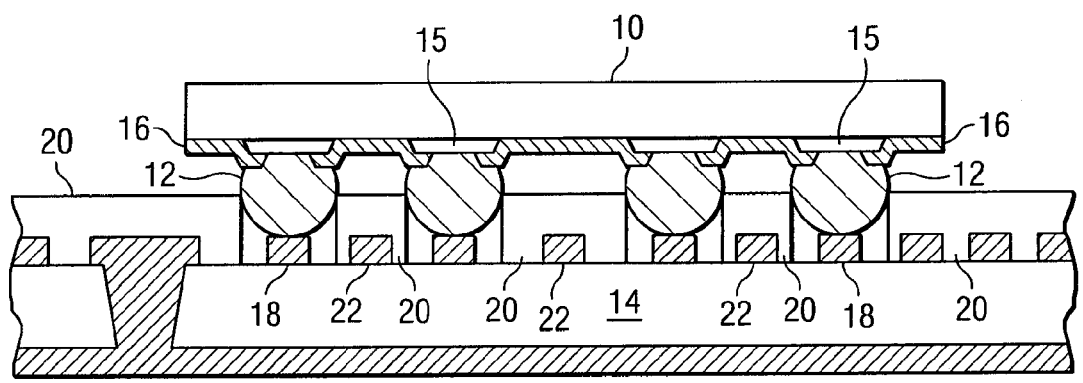
Figure 2:
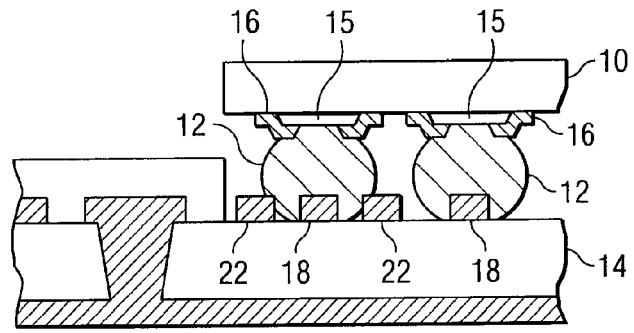
FIG. 2 illustrates the solder bumps bridging to signal traces formed adjacent to the bonding pads.
Figure 4C:
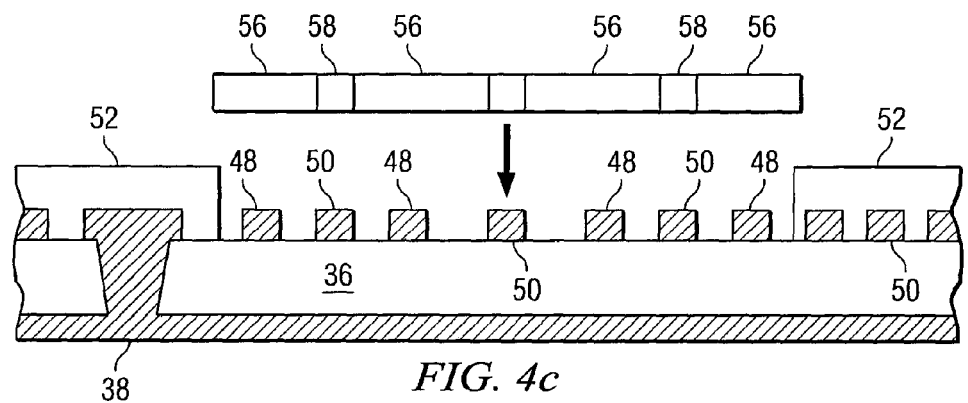
Figure 4D:
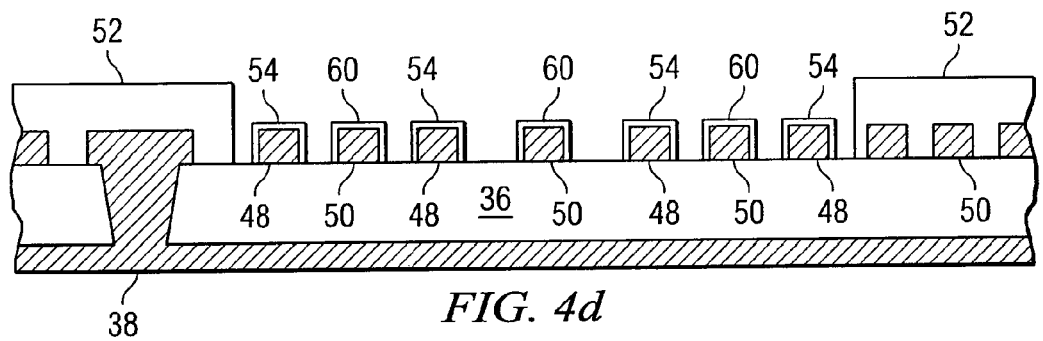
Figure 5A:
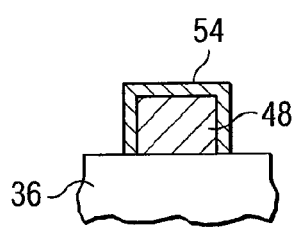
FIGS. 5a-5b illustrate the surface treatment formed on the contact pad and the oxide layer formed on the signal trace.
Figure 5B:
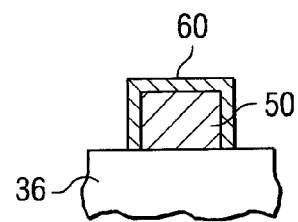

In FIG. 4c, the remaining portion of solder mask 52 is exposed and developed. Since the solder mask is removed, contact pads 48 and signal traces 50 in FIG. 3b are no longer constrained by the design rule used in the prior art implementation of FIG. 1b. A film layer 56 is formed over contact pads 48. The film layer 56 can be made with dry film and artwork film and then UV irradiation. Film layer 56 has openings 58 to expose signal traces 50. An oxidation treatment is applied to film layer 56 to selectively form an oxide layer through openings 58 onto signal traces 50. The oxide layer can be made with cupric oxide layer from an oxygen atmosphere. Film layer 56 and electroless surface treatment 54 prevents formation of an oxide layer on contact pads 48. FIG. 5b shows oxide layer 60 formed over contact pad 48. In FIG. 4d, the film layer 56 is removed leaving contact pads 48 covered by electroless surface treatment 54 and signal traces 50 coated with oxide layer 60.

Figure 6A:
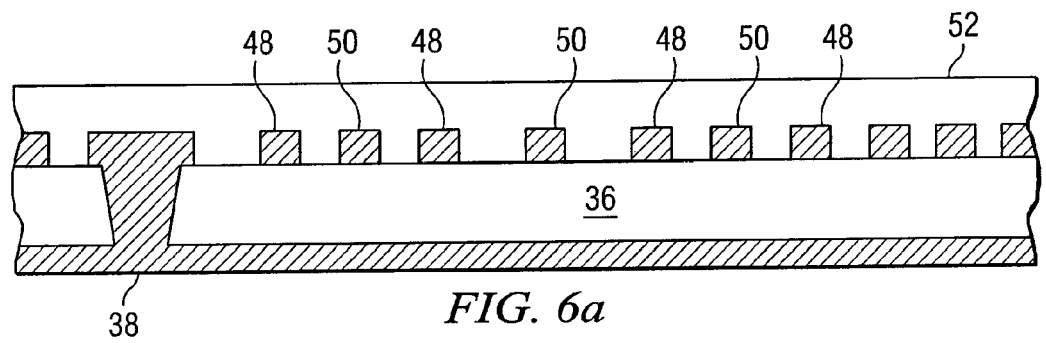
FIGS. 6a-6g illustrate an alternate process of forming the surface treatment on the contact pads and the oxide layer on the signal traces.
Figure 6B:
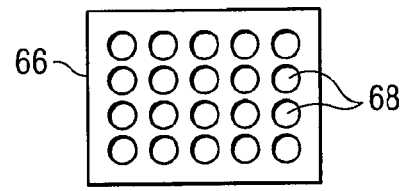
Figure 6C:
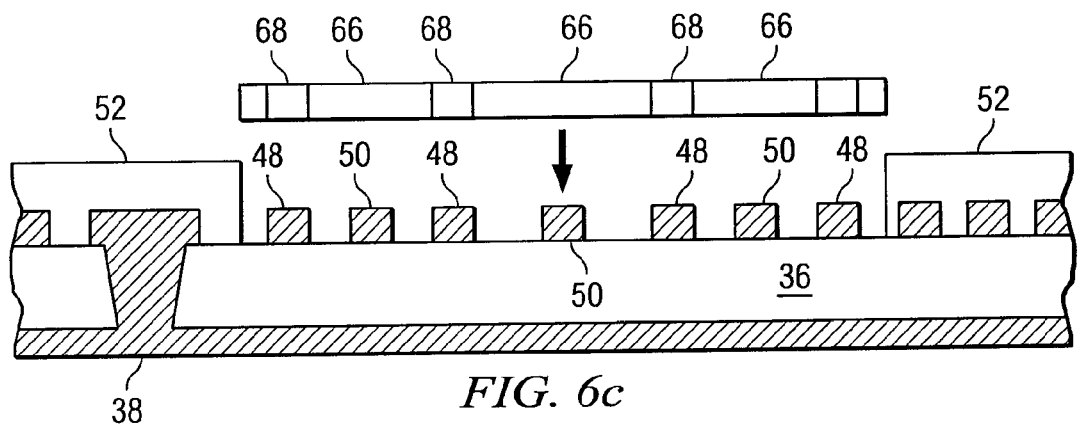
Figure 6D:
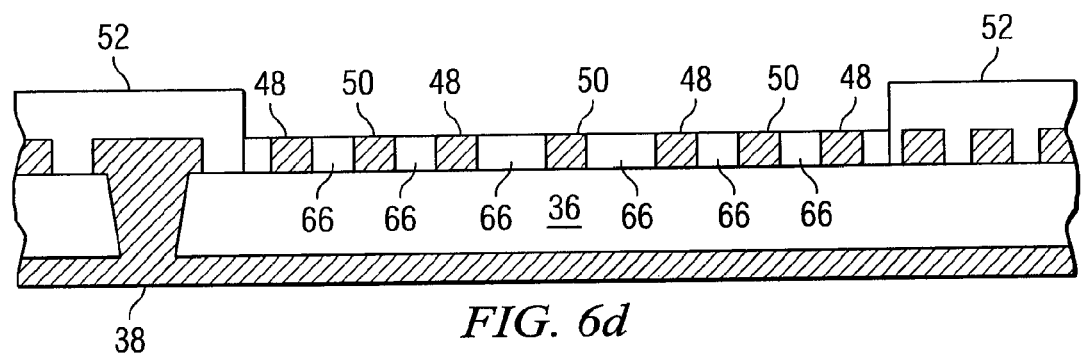
Figure 6E:
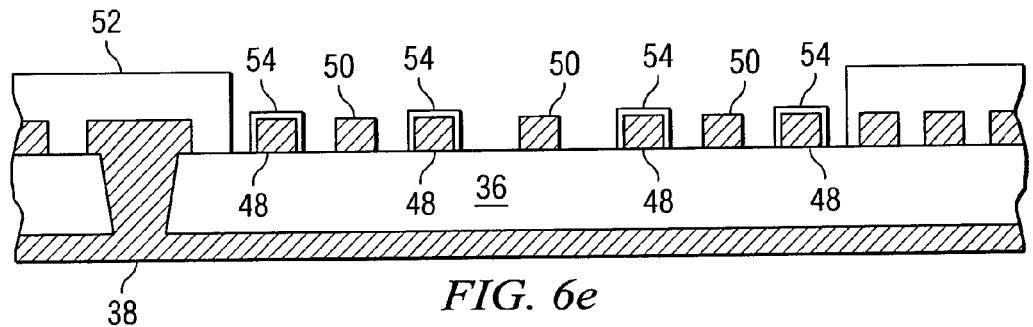

An alternate embodiment of forming the fine pitch, high-density contact pads 48 and signal traces 50 is shown in FIGS. 6a-6f. FIG. 6a shows the multi-layer PCB 36 with a plurality of contact pads 48 and signal traces 50 formed on the PCB. A solder mask 52 is formed over contact pads 48 and signal traces 50. The solder mask is patterned, exposed to UV light, and developed to remove all portions of the solder mask over contact pads 48 and signal traces 50. FIG. 6b is a top view of film layer 66 with openings 68. In FIGS. 6c and 6d, film layer 66 is applied over signal traces 50. The openings 68 of film layer 66 expose contact pads 48. An electroless surface treatment is selectively applied to contact pads 48 by immersion in a solution of Sn, ENIG, or OSP. Film layer 66 prevents formation of the electroless surface treatment on signal traces 50. Film layer 66 is then removed. FIG. 6e shows electroless surface treatment 54 formed over contact pads 48.

Figure 6F:
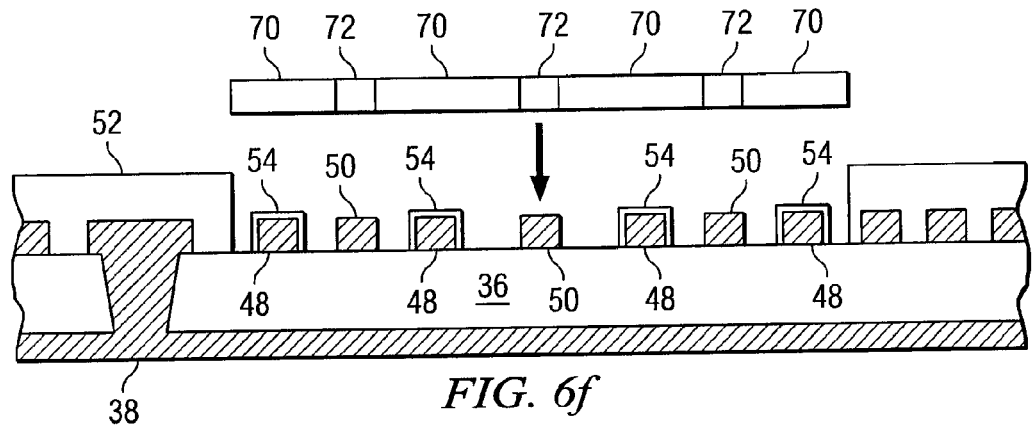
Figure 6G:
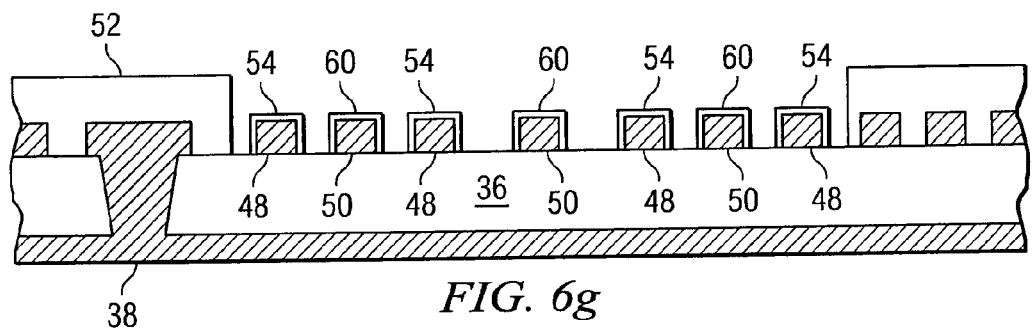

In FIG. 6f, a film layer 70 is applied over contact pads 48. Film layer 70 has openings 72 over signal traces 50. An oxidation treatment is applied to film layer 70 to selectively form an oxide layer through openings 72 onto signal traces 50. Film layer 70 and electroless surface treatment 54 prevents formation of the oxide layer on contact pads 48. Film layer 70 is then removed. FIG. 6g shows contact pads 48 covered by electroless surface treatment 54 and signal traces 50 coated with oxide layer 60.

Figure 7:
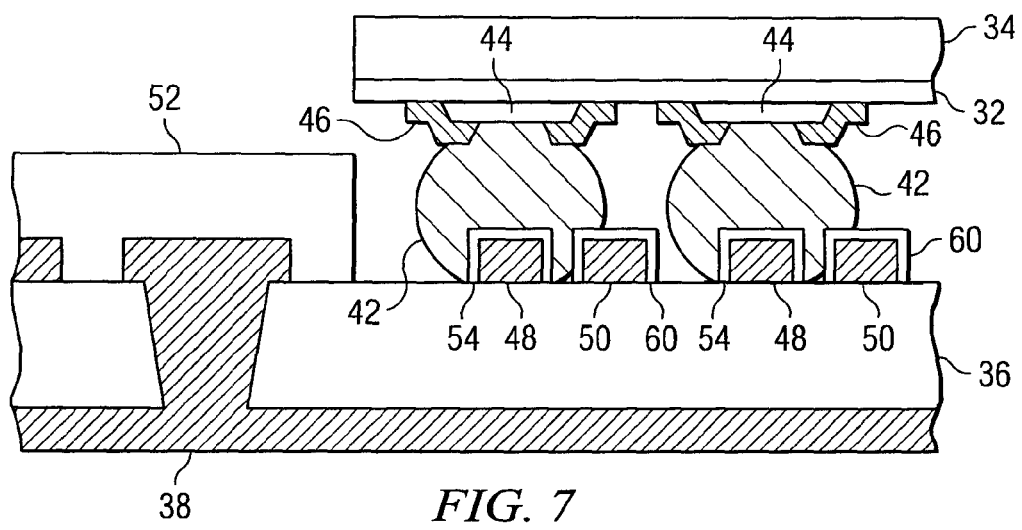
FIG. 7 illustrates a cross-sectional view of a flip chip semiconductor device with oxidized signal traces for electrical isolation from solder bumps formed on adjacent contact pads.

In FIG. 7, the solder bumps 42 formed on bump pads 44 of semiconductor die 34 are metallurgically and electrically connected to contact pads 48 on PCB 36 using a solder reflow process. The electroless surface treatment 54 on contact pads 48 aids in the metallurgical connection. The spacing between contact pads 48 and signal traces 50 is a fine pitch, less than 150 μm. Accordingly, during the solder reflow process, the solder material may extend over signal trace 50 due to misalignment or irregular bump diameter. In the event that solder bump 42 physically contacts oxide layer 60 over signal trace 50, the oxide coating over the signal trace maintains electrical isolation between the solder bump and signal trace. The oxidized signal trace does not melt with the contact pad during the solder reflow process. Under the fine pitch design rule, solder bumps 42 can extend outside the boundaries of contact pads 48, including the area over signal traces 50, without unintentionally electrically bridging or shorting the contact pad to the signal trace. Moreover, by completely removing the solder mask 52 from contact pads 48 and signal traces 50, these interconnect structures can be placed closer together, i.e., given a finer pitch, without causing defects as the design rule requiring additional lateral spacing for the solder mask between contact pads is no longer necessary. The oxide layer 60 over signal trace 50 maintains electrical isolation of the signal trace with respect to solder bump 42 and contact pad 48.

Figure 8:
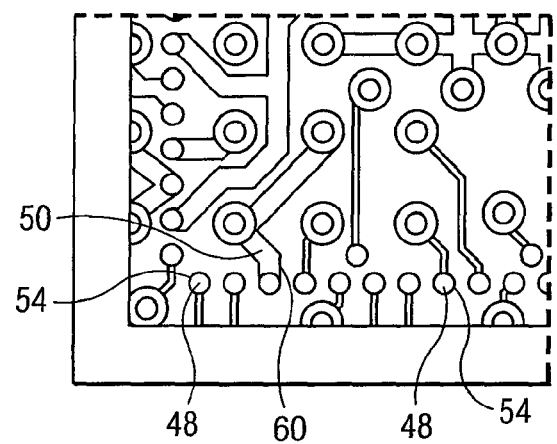
FIG. 8 illustrates a top view of a flip chip semiconductor device with oxidized signal traces for electrical isolation from solder bumps formed on adjacent contact pads.

FIG. 8 shows a top view of a corner of PCB 36. Contact pads 48 are coated with an electroless surface treatment 54. Signal traces 50 are coated with oxide layer 60. Due to the fine pitch, the solder bumps, which are metallurgically connected to contact pads 48, may extend over signal traces 50. However, no defect occurs because the contact pad remains electrically isolated from the signal trace due to the oxide layer formed over the signal trace. The oxidized signal trace does not melt with the contact pad during the solder reflow process.

In summary, the demand for higher interconnect density and reduced packaging cost require a fine pitch for high I/O count. By removing the final solder mask from the design, the semiconductor package can have a finer pitch between the interconnect structures and a higher I/O density. The signal traces are coated with an oxide layer to prevent solder bridging during the solder reflow process which metallurgically joins the solder bumps to the contact pads. In the event that solder bump 42 physically contacts the oxide layer over the signal trace, due to misalignment or irregular bump diameter, the oxidized signal trace does not melt with the contact pad during the solder reflow process. The contact pad and solder bump remain electrically isolated from the signal trace by virtue of the oxide layer formed over the signal trace.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a semiconductor die having a bump formed over a surface of the semiconductor die;

providing a substrate;

forming a contact pad on the substrate;

forming a signal trace on the substrate;

forming a mask over the signal trace with an opening over the contact pad;

forming a surface treatment over the contact pad after forming the mask;

removing the mask after forming the surface treatment;

forming a film layer over the contact pad with an opening over the signal trace after removing the mask;

selectively forming an oxide layer over the signal trace in the opening of the film layer, the film layer and surface treatment preventing formation of the oxide layer over the contact pad;

removing the film layer after forming the oxide layer; and reflowing the bump to metallurgically and electrically bond to the contact pad, the oxide layer maintaining electrical isolation between the bump and signal trace in the event that the bump physically contacts the oxide layer over the signal trace.

2. The method of claim 1, wherein the contact pad and signal trace have a pitch less than 150 micrometers.

3. The method of claim 1, wherein forming the surface treatment includes immersing the contact pad in a solution of tin, electroless nickel immersion gold, or organic solderability preservative.

4. The method of claim 1, wherein forming the oxide layer includes a cupric oxide layer.

5. The method of claim 1, wherein forming the film layer includes a dry film or artwork film.

6. A method of making a semiconductor device, comprising:
   providing a semiconductor die having a bump formed over a surface of the semiconductor die;
   providing a substrate;
   forming a contact pad on the substrate;
   forming a signal trace on the substrate;
   forming a surface treatment over the contact pad;
   forming a first film layer over the contact pad with an opening over the signal trace;
   selectively forming an insulating layer over the signal trace in the opening of the first film layer, the first film layer and surface treatment preventing formation of the insulating layer over the contact pad;
   removing the first film layer; and
   reflowing the bump to metallurgically and electrically bond to the contact pad.

7. The method of claim 6, wherein forming the surface treatment includes:
   forming a mask over the signal trace with an opening over the contact pad;
   forming the surface treatment over the contact pad; and
   removing the mask.

8. The method of claim 6, wherein forming the surface treatment includes:
   forming a second film layer over the signal trace with an opening over the contact pad;
   forming the surface treatment over the contact pad; and
   removing the second film layer.

9. The method of claim 6, wherein the contact pad and signal trace have a pitch less than 150 micrometers.

10. The method of claim 6, wherein forming the surface treatment includes immersing the contact pad in a solution of tin, electroless nickel immersion gold, or organic solderability preservative.

11. The method of claim 6, wherein forming the oxide layer includes a cupric oxide layer.

12. The method of claim 6, wherein forming the film layer includes a dry film or artwork film.

13. The method of claim 6, wherein the oxide layer maintains electrical isolation between the bump and signal trace in the event that the bump physically contacts the oxide layer over the signal trace.

14. A method of making a semiconductor device, comprising:
   providing a semiconductor die having a bump formed over a surface of the semiconductor die;
   providing a substrate;
   forming a contact pad on the substrate;
   forming a signal trace on the substrate;
   forming a surface treatment over the contact pad;
   selectively forming an insulating layer over the signal trace only in an area of the signal trace adjacent to the contact pad; and
   reflowing the bump to metallurgically and electrically bond to the contact pad, the oxide layer maintaining electrical isolation between the bump and signal trace in the event that the bump physically contacts the oxide layer over the signal trace.

15. The method of claim 14, wherein forming the surface treatment includes:
   forming a mask over the signal trace with an opening over the contact pad;
   forming the surface treatment over the contact pad; and
   removing the mask.

16. The method of claim 14, wherein forming the surface treatment includes:
   forming a first film layer over the signal trace with an opening over the contact pad;
   forming the surface treatment over the contact pad; and
   removing the first film layer.

17. The method of claim 14, wherein forming the insulating includes:
   forming a second film layer over the contact pad with an opening over the signal trace;
   forming the insulating layer over the signal trace; and
   removing the second film layer.

18. The method of claim 14, wherein forming the insulating layer includes a cupric oxide layer.

19. The method of claim 14, wherein the contact pad and signal trace have a pitch less than 150 micrometers.

20. The method of claim 14, wherein forming the surface treatment includes immersing the contact pad in a solution of tin, electroless nickel immersion gold, or organic solderability preservative.

21. A semiconductor device, comprising:
   a semiconductor die having a bump formed over a surface of the semiconductor die;
   a substrate;
   a contact pad formed on the substrate;
   a signal trace formed on the substrate;
   a surface treatment formed over the contact pad; and
   an insulating layer selectively formed over the signal trace only in an area of the signal trace adjacent to the contact pad, wherein the bump is metallurgically and electrically bonded to the contact pad, the oxide layer maintaining electrical isolation between the bump and signal trace in the event that the bump physically contacts the oxide layer over the signal trace.

22. The semiconductor device of claim 21, wherein the insulating layer includes a cupric oxide layer.

23. The semiconductor device of claim 21, wherein the contact pad and signal trace have a pitch less than 150 micrometers.

24. The semiconductor device of claim 21, wherein the surface treatment includes tin, electroless nickel immersion gold, or organic solderability preservative.

25. The semiconductor device of claim 21, wherein the film layer includes a dry film or artwork film.

* * * * *